(12) United States Patent  (10) Patent No.: US 8,551,831 B2
Gao et al.  (45) Date of Patent: Oct. 8, 2013

(54) SILICON GERMANIUM AND POLYSILICON GATE STRUCTURE FOR STRAINED SILICON TRANSISTORS

(75) Inventors: Da Wei Gao, Shanghai (CN); Bei Zhu, Shanghai (CN); Hanming Wu, Shanghai (CN); John Chen, Shanghai (CN); Paolo Bonfanti, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 477 days.

(21) Appl. No.: 12/234,393

(22) Filed: Sep. 19, 2008

(65) Prior Publication Data

US 2009/0152599 A1   Jun. 18, 2009

(51) Int. Cl.
 *H01L 21/8238* (2006.01)
(52) U.S. Cl.
 USPC ............ 438/199; 257/288; 257/E21.431; 257/E29.255
(58) Field of Classification Search
 USPC .......... 438/199; 257/288, E21.431, E29.255
 See application file for complete search history.

(56) References Cited

U.S. PATENT DOCUMENTS

| | | | |
|---|---|---|---|
| 5,168,072 A | 12/1992 | Moslehi | |
| 6,043,545 A | 3/2000 | Tseng et al. | |
| 6,121,100 A | 9/2000 | Andideh et al. | |
| 6,179,973 B1 | 1/2001 | Lai et al. | |
| 6,251,242 B1 | 6/2001 | Fu et al. | |
| 6,274,894 B1 | 8/2001 | Wieczorek et al. | |
| 6,277,249 B1 | 8/2001 | Gopalraja et al. | |

(Continued)

FOREIGN PATENT DOCUMENTS

| CN | 1499578 A | | 5/2004 |
|---|---|---|---|
| JP | 2006-186240 | * | 7/2006 |
| WO | WO 0154175 A1 | | 7/2001 |
| WO | WO 2005038890 A1 | | 4/2005 |

OTHER PUBLICATIONS

Belford, et al., "Performance-Augmented CMOS Using Back-End Uniaxial Strain", 2002, Device Research Conference, Santa Barbara, California, pp. 1-2.

(Continued)

*Primary Examiner* — Julio J Maldonado
*Assistant Examiner* — Sonya D McCall Shepard
(74) *Attorney, Agent, or Firm* — Kilpatrick Townsend & Stockton LLP

(57) ABSTRACT

An integrated circuit semiconductor device, e.g., MOS, CMOS. The device has a semiconductor substrate. The device also has a dielectric layer overlying the semiconductor substrate and a gate structure overlying the dielectric layer. A dielectric layer forms sidewall spacers on edges of the gate structure. A recessed region is within a portion of the gate structure within the sidewall spacer structures. An epitaxial fill material is within the recessed region. The device has a source recessed region and a drain recessed region within the semiconductor substrate and coupled to the gate structure. The device has an epitaxial fill material within the source recessed region and within the drain recessed region. A channel region is between the source region and the drain region is in a strain characteristic from at least the fill material formed in the source region and the drain region. Depending upon the embodiment, the fill material can be any suitable species such as silicon germanium, silicon carbide, and others.

18 Claims, 4 Drawing Sheets

(56) References Cited

U.S. PATENT DOCUMENTS

| | | |
|---|---|---|
| 6,291,321 B1 | 9/2001 | Fitzgerald |
| 6,352,629 B1 | 3/2002 | Wang |
| 6,372,569 B1 | 4/2002 | Lee et al. |
| 6,406,599 B1 | 6/2002 | Subramani et al. |
| 6,406,973 B1 * | 6/2002 | Lee .................. 438/416 |
| 6,483,151 B2 | 11/2002 | Wakabayashi et al. |
| 6,503,773 B2 | 1/2003 | Fitzgerald |
| 6,514,836 B2 | 2/2003 | Belford |
| 6,563,152 B2 | 5/2003 | Roberds et al. |
| 6,566,276 B2 | 5/2003 | Maloney et al. |
| 6,617,623 B2 | 9/2003 | Rhodes |
| 6,713,357 B1 | 3/2004 | Wang |
| 6,730,196 B2 | 5/2004 | Wang et al. |
| 6,881,635 B1 | 4/2005 | Chidambarrao et al. |
| 6,891,192 B2 | 5/2005 | Chen et al. |
| 7,052,946 B2 | 5/2006 | Chen et al. |
| 7,078,722 B2 | 7/2006 | Anderson et al. |
| 7,195,985 B2 * | 3/2007 | Murthy et al. .................. 438/341 |
| 7,381,623 B1 | 6/2008 | Chen et al. |
| 7,425,488 B2 | 9/2008 | Wu et al. |
| 7,446,026 B2 | 11/2008 | Zhang et al. |
| 7,547,595 B2 | 6/2009 | Ning |
| 7,557,000 B2 | 7/2009 | Chen et al. |
| 7,709,336 B2 | 5/2010 | Ning |
| 7,820,500 B2 | 10/2010 | Ning |
| 2002/0106845 A1 | 8/2002 | Chao et al. |
| 2002/0190284 A1 | 12/2002 | Murthy et al. |
| 2003/0080361 A1 | 5/2003 | Murthy et al. |
| 2003/0139001 A1 | 7/2003 | Snyder et al. |
| 2004/0063300 A1 | 4/2004 | Chi |
| 2005/0035409 A1 | 2/2005 | Ko et al. |
| 2005/0142768 A1 | 6/2005 | Lindert et al. |
| 2005/0145956 A1 | 7/2005 | Wang et al. |
| 2005/0158931 A1 | 7/2005 | Chen et al. |
| 2005/0179066 A1 | 8/2005 | Murthy et al. |
| 2006/0052947 A1 | 3/2006 | Hu |
| 2006/0086987 A1 | 4/2006 | Chen et al. |
| 2006/0105511 A1 | 5/2006 | Yang et al. |
| 2006/0115949 A1 | 6/2006 | Zhang et al. |
| 2006/0138398 A1 | 6/2006 | Shimamune et al. |
| 2006/0145273 A1 | 7/2006 | Curello et al. |
| 2006/0220153 A1 | 10/2006 | Murthy |
| 2006/0237746 A1 | 10/2006 | Orlowski et al. |
| 2007/0020864 A1 | 1/2007 | Chong et al. |
| 2007/0072353 A1 | 3/2007 | Wu et al. |
| 2007/0072376 A1 | 3/2007 | Chen et al. |
| 2007/0128786 A1 | 6/2007 | Cheng et al. |
| 2007/0138570 A1 | 6/2007 | Chong et al. |
| 2007/0184668 A1 | 8/2007 | Ning et al. |
| 2007/0196992 A1 | 8/2007 | Xiang et al. |
| 2008/0119019 A1 | 5/2008 | Han et al. |
| 2008/0124874 A1 | 5/2008 | Park et al. |
| 2008/0191244 A1 | 8/2008 | Kim et al. |
| 2008/0251851 A1 | 10/2008 | Pan et al. |
| 2008/0283926 A1 | 11/2008 | Sridhar |
| 2009/0023258 A1 | 1/2009 | Liang et al. |
| 2009/0065805 A1 | 3/2009 | Wu et al. |
| 2009/0085125 A1 | 4/2009 | Kim et al. |
| 2009/0289379 A1 | 11/2009 | Han et al. |
| 2010/0124818 A1 | 5/2010 | Lee et al. |
| 2010/0224937 A1 | 9/2010 | Sridhar |

OTHER PUBLICATIONS

Comita, et al., "Low Temperature Si and SiGe Epitaxy for sub 01.μm Technology", 2003, Epi Technology Development Group Si Deposition Key Product Unit, Applied Materials, pp. 1-3.
Chuang, et al., "Design Considerations of SOI Digital CMOS VLSI", 1998, Proceedings 1998 IEEE International SOI Conference, pp. 5-8.
Final Office Action for U.S. Appl. No. 11/678,582, mailed on Oct. 30, 2009, 20 pages.
Final Office Action for U.S. Appl. No. 11/244,955, mailed on Mar. 26, 2010, 9 pages.
Final Office Action for for U.S. Appl. No. 11/678,582, mailed on Apr. 15, 2010, 21 pages.
Final Office Action for U.S. Appl. No. 11/442,009, mailed on Nov. 19, 2010, 13 pages.
Ge, et al., "Process-strained Si (PSS) CMOS Technology Featuring 3D Strain Engineering," 2003, IEEE International Electron Devices Meeting, Washington, DC., pp. 1-4.
Non-Final Office Action for U.S. Appl. No. 11/442,009, mailed on Jan. 5, 2009, 20 pages.
Non-Final Office Action for for U.S. Appl. No. 11/678,582, mailed on Apr. 28, 2009, 18 pages.
Non-Final Office Action for U.S. Appl. No. 11/244,955, mailed on Sep. 1, 2009, 9 pages.
Non-Final Office Action for U.S. Appl. No. 11/442,009, mailed on Jul. 12, 2010, 13 pages.
Non-Final Office Action for U.S. Appl. No. 11/244,955, mailed on Dec. 22, 2010, 9 pages.
Non-Final Office Action for U.S. Appl. No. 11/678,582, mailed on Apr. 5, 2011, 22 pages.
Non-Final Office Action for U.S. Appl. No. 11/442,009, mailed on Apr. 27, 2011, 11 pages.
Notice of Allowance for U.S. Appl. No. 11/609,748, mailed on Jun. 24, 2009, 6 pages.
Requirement for Restriction/Election for U.S. Appl. No. 11/244,955, mailed on Jul. 17, 2008, 5 pages.
Requirement for Restriction/Election for U.S. Appl. No. 11/678,582, mailed on Jul. 24, 2008, 3 pages.
Requirement for Restriction/Election for U.S. Appl. No. 11/244,955, mailed on Dec. 3, 2008, 5 pages.
Requirement for Restriction/Election for U.S. Appl. No. 11/244,955, mailed on Apr. 1, 2009, 3 pages.
Thompson, S.E., "Strained Silicon MOSFETs: The Next Material Change to Extend Moore's Law," 2004, Spring Material Research Society 2004, pp. 1-37.
Notice of Allowance for U.S. Appl. No. 12/845,676, mailed on Jul. 25, 2011, 10 pages.
Final Office Action for U.S. Appl. No. 11/471,071, mailed on Jun. 24, 2008, 15 pages.
Final Office Action for U.S. Appl. No. 11/321,767, mailed on Aug. 29, 2008, 7 pages.
Final Office Action for U.S. Appl. No. 11/471,071, mailed on Jul. 14, 2009, 17 pages.
Final Office Action for U.S. Appl. No. 11/471,071, mailed on Mar. 2, 2010, 17 pages.
Non-Final Office Action for U.S. Appl. No. 11/471,071, mailed on Jan. 3, 2008, 18 pages.
Non-Final Office Action for U.S. Appl. No. 11/321,767, mailed on Feb. 25, 2008, 6 pages.
Non-Final Office Action for U.S. Appl. No. 11/471,071, mailed on Nov. 3, 2008, 16 pages.
Non-Final Office Action for U.S. Appl. No. 11/321,767, mailed on Feb. 18, 2009, 8 pages.
Non-Final Office Action for U.S. Appl. No. 11/321,767, mailed on Aug. 31, 2009, 6 pages.
Non-Final Office Action for U.S. Appl. No. 11/471,071, mailed on Oct. 26, 2009, 18 pages.
Notice of Allowance for U.S. Appl. No. 11/321,767, mailed on Dec. 16, 2009, 3 pages.
Notice of Allowance for U.S. Appl. No. 11/471,071, mailed on Jun. 4, 2010, 3 pages.
Notice of Allowance for U.S. Appl. No. 11/471,071, mailed on Jul. 16, 2010, 7 pages.
Requirement for Restriction/Election for U.S. Appl. No. 11/321,767 mailed on Jul. 5, 2007, 5 pages.
Final Office Action for U.S. Appl. No. 11/442,009, mailed on Oct. 5, 2011, 10 pages.
Final Office Action for U.S. Appl. No. 11/244,955, mailed on Oct. 19, 2011, 9 pages.

* cited by examiner

SILICON GERMANIUM AND POLYSILICON GATE STRUCTURE FOR STRAINED SILICON TRANSISTORS

BACKGROUND OF THE INVENTION

The present invention is directed to integrated circuits and their processing for the manufacture of semiconductor devices. More particularly, the invention provides a method and structures for manufacturing MOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

In a specific embodiment, the present invention provides a method for forming an integrated circuit semiconductor device, e.g., MOS, CMOS. The method includes providing a semiconductor substrate, e.g., silicon substrate, silicon on insulator. The method includes forming a dielectric layer (e.g., silicon dioxide, silicon nitride, silicon oxynitride) overlying the semiconductor substrate. The method includes forming a gate layer overlying the dielectric layer. Preferably, the gate layer is a polysilicon material, which has been doped using an in-situ doping technique, among others. The method includes patterning the gate layer to form a gate structure including edges, e.g., vertical edges. The method forms a dielectric layer overlying the gate structure to protect the gate structure including the edges and patterns the dielectric layer to form sidewall spacer structures on the edges of the gate structure. The method etches a source region and a drain region adjacent to the gate structure using the dielectric layer as a protective layer and etches a portion of the gate structure to form a recessed region within the sidewall spacer structures, also using the dielectric layer as a masking layer. The method deposits silicon germanium material into the source region and the drain region to fill the etched source region and the etched drain region. The method also deposits silicon germanium material into the recessed region in the gate structure, which causes a channel region between the source region and the drain region to be strained in compressive mode from at least the silicon germanium material formed in the source region and the drain region.

In an alternative specific embodiment, the present invention provides an integrated circuit semiconductor device, e.g., MOS, CMOS. The device has a semiconductor substrate. The device also has a dielectric layer overlying the semiconductor substrate and a gate structure overlying the dielectric layer. A dielectric layer forms sidewall spacers on edges of the gate structure. A recessed region is within a portion of the gate structure within the sidewall spacer structures. A silicon germanium fill material is within the recessed region. The device has a source recessed region and a drain recessed region within the semiconductor substrate and coupled to the gate structure. The device has a silicon germanium fill material within the source recessed region and within the drain recessed region. A channel region is between the source region and the drain region is in a strain characteristic from at least the silicon germanium fill material formed in the source region and the drain region.

In yet an alternative specific embodiment, the present invention provides an integrated circuit semiconductor device, e.g., MOS, CMOS. The device has a semiconductor substrate. The device also has a dielectric layer overlying the semiconductor substrate and a gate structure overlying the dielectric layer. A dielectric layer forms sidewall spacers on edges of the gate structure. A recessed region is within a portion of the gate structure within the sidewall spacer structures. An epitaxial fill material is within the recessed region. The device has a source recessed region and a drain recessed region within the semiconductor substrate and coupled to the gate structure. The device has an epitaxial fill material within the source recessed region and within the drain recessed region. A channel region is between the source region and the drain region is in a strain characteristic from at least the fill material formed in the source region and the drain region. Depending upon the embodiment, the fill material can be any suitable species such as silicon germanium, silicon carbide, and others.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 65 nanometers and less or 90 nanometers and less. Additionally, the invention provides for increased mobility of holes using a strained silicon structure for CMOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1A:
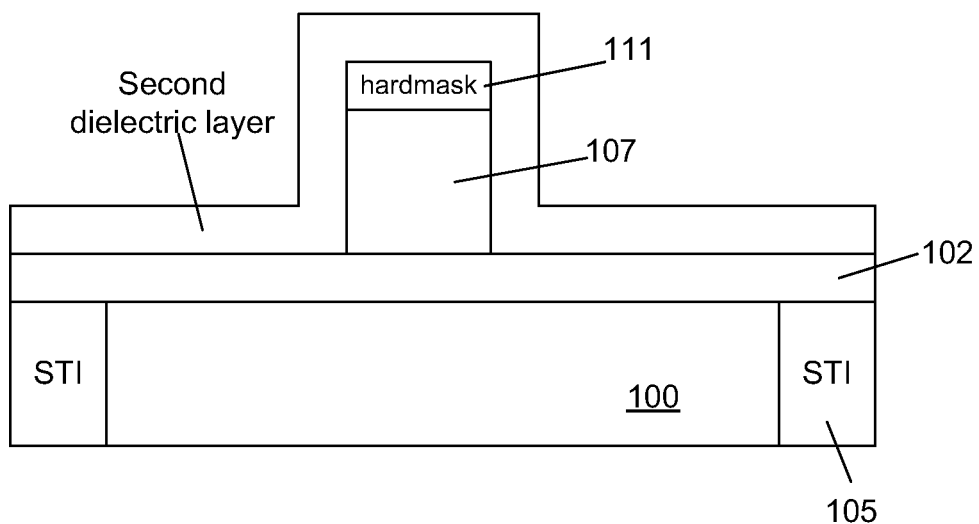
FIGS. 1A-1B through 4 are simplified cross-sectional view diagram of a method for fabricating a strained silicon MOS device according to an embodiment of the present invention.

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

A method for fabricating an integrated circuit device according to an embodiment of the present invention may be outlined as follows:

1. Provide a semiconductor substrate, e.g., silicon wafer, silicon on insulator;
2. Form a dielectric layer (e.g., gate oxide or nitride) overlying the semiconductor substrate;
3. Form a gate layer (e.g., polysilicon, metal) overlying the dielectric layer;
4. Form a hard mask overlying the gate layer;
5. Pattern the gate layer to form a gate structure including edges (e.g., a plurality of sides or edges);
6. Form a dielectric layer overlying the gate structure to protect the gate structure including the edges;
7. Pattern the dielectric layer to form sidewall spacers on edges of the gate structure;
8. Remove the hard mask layer;
9. Etch the source region and the drain region adjacent to the gate structure using the dielectric layer as the protective layer;
10. Form a recessed region between the sidewall spacers by etching a portion of the gate structure;
11. Deposit silicon germanium material into the source region and the drain region to fill the etched source region and the etched drain region;
12. Deposit silicon germanium material into the recessed region of the gate structure;
13. Cause a channel region between the source region and the drain region to be strained in compressive mode from at least the silicon germanium material formed in the source region and the drain region, wherein the channel region is about the same width as the patterned gate layer; and
14. Perform other steps, as desired.

The above sequence of steps provides a method according to an embodiment of the present invention. As shown, the method uses a combination of steps including a way of forming an integrated circuit device such as an N-type channel device for a CMOS integrated circuit. In a preferred embodiment, the method forms a recessed region in the gate structure and fills such region with silicon germanium bearing material, which has lower resistivity than conventional gate structures. Other alternatives can also be provided where steps are added, one or more steps are removed, or one or more steps are provided in a different sequence without departing from the scope of the claims herein. Further details of the present method can be found throughout the present specification and more particularly below.

A method for fabricating a CMOS integrated circuit device according to an alternative embodiment of the present invention may be outlined as follows:

1. Provide a semiconductor substrate, e.g., silicon wafer, silicon on insulator;
2. Form a gate dielectric layer overlying the surface of the substrate;
3. Form a gate layer overlying the semiconductor substrate;
4. Form a hard mask layer overlying the gate layer;
5. Pattern the gate layer, including the hard mask layer, to form an NMOS gate structure including edges and a PMOS gate structure including edges;
6. Form a dielectric layer overlying the NMOS gate structure to protect the NMOS gate structure including the edges and overlying the PMOS gate structure to protect the PMOS gate structure including the edges;
7. Form sidewall spacers on edges of the gate structures from the dielectric layer;
8. Remove the hard mask layer on the gate structures;
9. Simultaneously etch a first source region and a first drain region adjacent to the NMOS gate structure and etch a second source region and a second drain region adjacent to the PMOS gate structure using the dielectric layer as a protective layer;
10. Form a recessed region between the sidewall spacers by etching a portion of the gate structures;
11. Pretreat etched source/drain regions;
12. Mask NMOS regions;
13. Deposit silicon germanium material into the first source region and the first drain region to cause a channel region between the first source region and the first drain region of the PMOS gate structure to be strained in a compressive mode and deposit silicon germanium material into the recessed regions of the PMOS gate structure;
14. Strip Mask from NMOS regions;
15. Mask PMOS regions;
16. Deposit silicon carbide material into the second source region and second drain region to cause the channel region between the second source region and the second drain region of the NMOS gate structure to be strained in a tensile mode and deposit silicon germanium material into the recessed regions of the NMOS gate structure;
17. Perform other steps, as desired.

The above sequence of steps provides a method according to an embodiment of the present invention. As shown, the method uses a combination of steps including a way of forming a CMOS integrated circuit device. In a preferred embodiment, the method forms a recessed region in the gate structure and fills such region with silicon germanium bearing material, which has lower resistivity than conventional gate structures. Other alternatives can also be provided where steps are added, one or more steps are removed, or one or more steps are provided in a different sequence without departing from the scope of the claims herein. Further details of the present device can be found throughout the present specification and more particularly below.

Figure 1B:
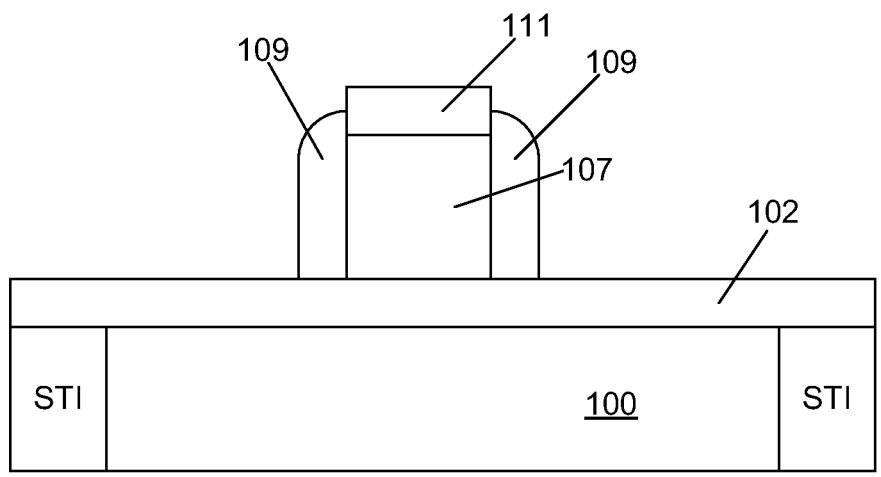
Figure 4:
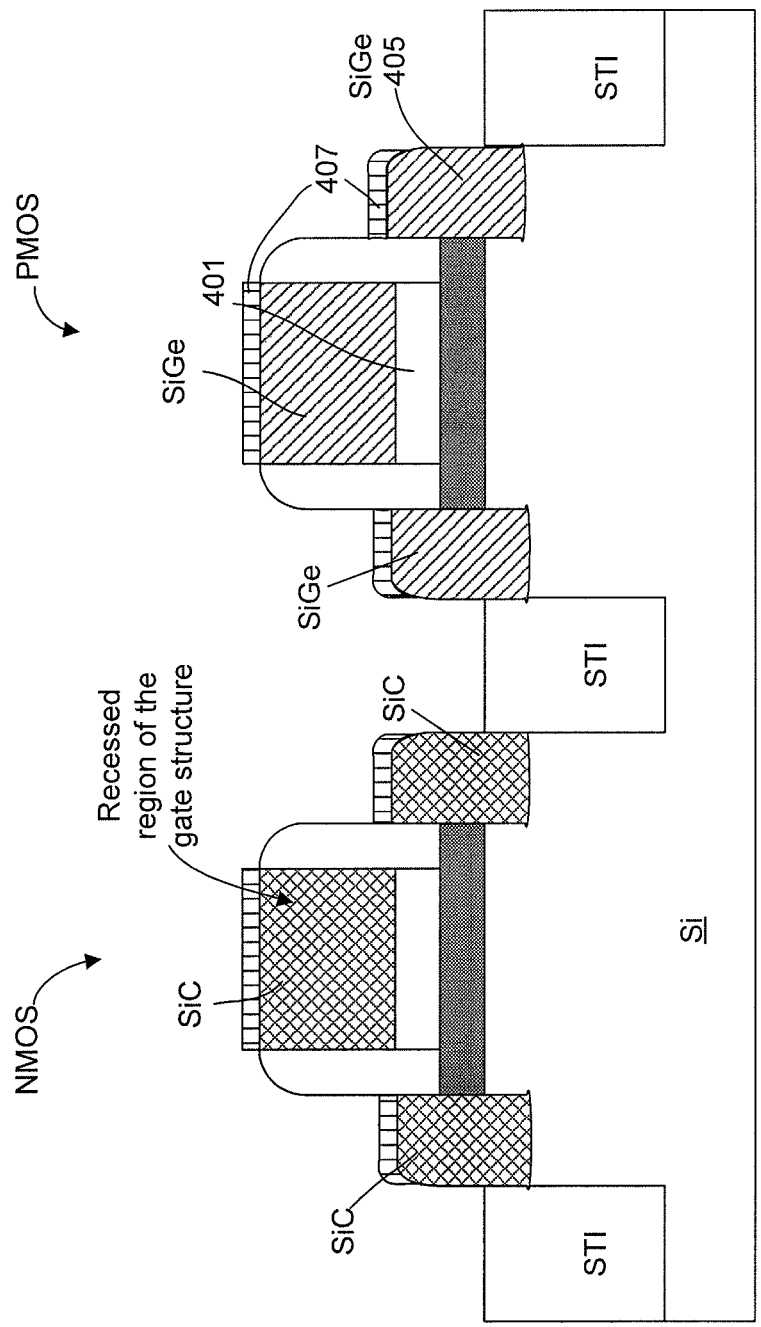

FIGS. 1A-1B through 4 are simplified cross-sectional view diagram of a method for fabricating a strained silicon MOS device according to an embodiment of the present invention.

These diagrams are merely examples, which should not unduly limit the scope of the claims herein. One of ordinary skill in the art would recognize many variations, alternatives, and modifications. As shown, the present invention provides a semiconductor integrated circuit device. As shown, the method provides a semiconductor substrate 100, e.g., silicon wafer, silicon on insulator. The semiconductor substrate is single crystalline silicon. The silicon has been oriented in the 100 direction on the face of the wafer. Of course, there can be other variations, modifications, and alternatives. Preferably, the method forms isolation regions 105 within the substrate. In a specific embodiment, the method forms a shallow trench isolation region or regions within a portion of the semiconductor substrate. The shallow trench isolation regions are formed using patterning, etching, and deposition of a dielectric fill material within the trench region. The dielectric fill material is often oxide or a combination of oxide and nitride depending upon the specific embodiment. The isolation regions are used to isolate active regions within the semiconductor substrate.

The method forms a gate dielectric layer 102 overlying the surface of the substrate. Preferably, the gate dielectric layer is oxide or silicon oxynitride depending upon the embodiment. The gate dielectric layer is preferably 10-20 nanometers and less depending upon the specific embodiment. The method forms a gate layer overlying the semiconductor substrate. The gate layer is preferably polysilicon that has been doped using either in-situ doping or ex-situ implantation techniques. The impurity for doping is often boron, arsenic, or phosphorus having a concentration ranging from about $1\times10^{19}$ to about $1\times10^{20}$ atoms/cm$^3$. A hard mask layer 111 is also formed, which will be used for patterning the gate layer to form the gate structure, as will be illustrated. Of course, one of ordinary skill in the art would recognize many variations, modifications, and alternatives.

In a specific embodiment, the method patterns the gate layer to form an NMOS gate structure including edges and patterns a PMOS gate structure 107 including edges using the hard mask layer. The method forms lightly doped drain regions and sidewall spacers 109 are formed on edges of patterned gate layer. Depending upon the embodiment, there may also be no sidewall spacers. The lightly doped drain regions are often formed using implantation techniques. For the PMOS device, the lightly doped drain region uses Boron or BF$_2$ impurity having a concentration ranging from about $1\times10^{18}$ to about $1\times10^{19}$ atoms/cm$^3$. For the NMOS device, the lightly doped drain region uses arsenic impurity having a concentration ranging from about $1\times10^{18}$ to about $1\times10^{19}$ atoms/cm$^3$.

Figure 2:
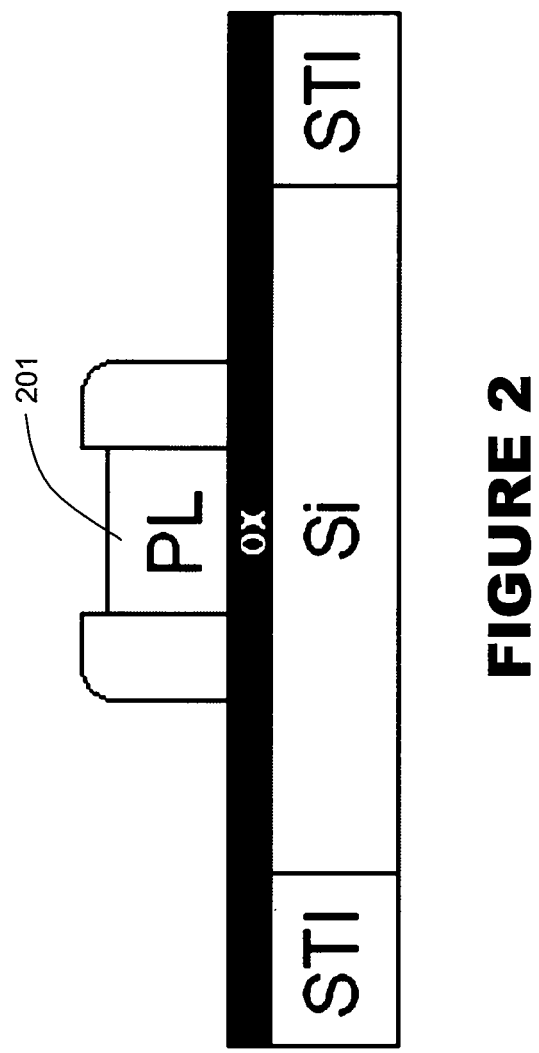

Referring to FIG. 2, the method removes the hard mask layer to expose a portion 201 of the gate structure according to a specific embodiment. The hard mask layer is removed via selective etching techniques and/or the like. The hard mask layer is selectively removed using a fluoric acid (HF) and/or phosphorous acid (H3PO4) solution or selective plasma etching technique. Of course, one of ordinary skill in the art would recognize many variations, modifications, and alternatives.

The method forms a dielectric layer overlying the NMOS gate structure to protect the NMOS gate structure including the edges. The method also forms a dielectric protective layer overlying the PMOS gate structure to protect the PMOS gate structure including the edges. Preferably, the dielectric protective layer is the same layer for PMOS and NMOS devices. Alternatively, another suitable material can be used to protect the NMOS and PMOS gate structures, including lightly doped drain regions.

Figure 3:
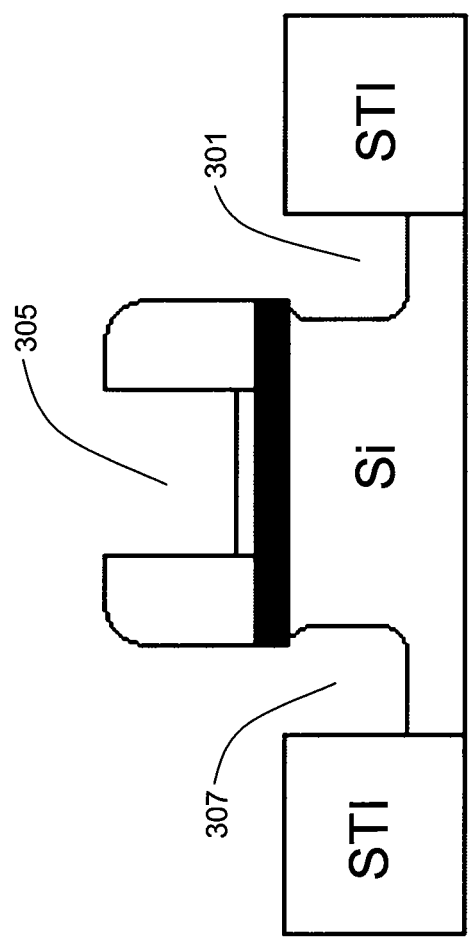

Referring to FIG. 3, the method simultaneously etches a first source region and a first drain region adjacent to the NMOS gate structure and etches a second source region 307 and a second drain region 301 adjacent to the PMOS gate structure using the dielectric layer as a protective layer. Simultaneously, the method forms a recessed region 305 between the sidewall spacer regions by removing a thickness of material from the gate structure. The method uses reactive ion etching techniques including a SF$_6$ or CF$_4$ bearing species and plasma environment. In a preferred embodiment, the method performs a pre-treatment process on etched source/drain regions, which preserves the etched interfaces to maintain substantially high quality silicon bearing material. According to a specific embodiment, the each of the etched source/drain regions has a depth of ranging from about 100 Angstroms (A) to about 1000 A and a length of about 0.1 um to about 10 um, and a width of about 0.1 um to about 10 um for a 90 nanometer channel length. Each of the etched regions has a depth of ranging from about 100 A to about 1,000 A and a length of about 0.1 um to about 10 um, and a width of about 0.1 um to about 10 um for a 65 nanometer channel length according to an alternative specific embodiment.

Referring to FIG. 4, the method strips the mask from NMOS regions. The method masks PMOS regions, while exposing the NMOS etched regions. The method deposits silicon carbide material into the second source region and second drain region to cause the NMOS channel region between the second source region and the second drain region of the NMOS gate structure to be strained in a tensile mode. The method also deposits the silicon carbide material into the recessed region of the gate structure according to a specific embodiment. The silicon carbide is epitaxially deposited using in-situ doping techniques. That is, impurities such as phosphorous (P) or arsenic (As) are introduced while the silicon carbide material grows. A concentration ranges from about $1\times10^{19}$ to about $1\times10^{20}$ atoms/cm$^3$ of the above impurities according to a specific embodiment. Of course, there can be other variations, modifications, and alternatives.

The method masks NMOS regions, while exposing the PMOS etched regions. The method deposits silicon germanium material into the first source region 405 and the first drain region to cause a channel region between the first source region and the first drain region of the PMOS gate structure to be strained in a compressive mode. Simultaneously, the method deposits silicon germanium material into the recessed region of the gate structure of the PMOS device. The silicon germanium is epitaxially deposited using in-situ doping techniques. That is, impurities such as boron are introduced while the silicon germanium material grows. A concentration ranges from about $1\times10^{19}$ to about $1\times10^{20}$ atoms/cm$^3$ of boron according to a specific embodiment. Of course, there can be other variations, modifications, and alternatives.

In a specific embodiment, the method forms an integrated gate structure that has selected characteristics. According to a specific embodiment, the integrated gate structure has a sheet resistivity of 20 ohm/square and less. The gate structure has a remaining thickness 401 of 100 Angstroms and greater after forming the recessed region according to a specific embodiment. The gate layer has an initial thickness of about 800 Angstroms to 2000 Angstroms according to a specific embodiment. Of course, one of ordinary skill in the art would recognize many other variations, modifications, and alternatives.

To finish the device according to an embodiment of the present invention, the method forms a silicide layer 407 overlying gate layer and source/drain regions. Preferably, the silicide layer is a nickel bearing layer such as nickel silicide overlying the exposed source/drain regions and upper surface of the patterned gate layer. Other types of silicide layers can also be used. Such silicide layers include titanium silicide, tungsten silicide, nickel silicide, and the like. The method forms an interlayer dielectric layer overlying NMOS and PMOS transistor devices. The method then performs electrical contacts. Other steps include performing a back end processes and other steps, as desired.

The above sequence of steps provides a method according to an embodiment of the present invention. As shown, the method uses a combination of steps including a way of forming a CMOS integrated circuit device. In a preferred embodiment, the method provides an in-situ doping process when filling the silicon germanium material into recessed regions corresponding to source/drain regions. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming an integrated circuit semiconductor device comprising:
providing a semiconductor substrate;
forming a dielectric layer overlying the semiconductor substrate;
forming a gate layer overlying the dielectric layer;
patterning the gate layer to form a gate structure including edges;
forming a second dielectric layer overlying the gate structure to protect the gate structure including the edges;
patterning the second dielectric layer to form sidewall spacer structures on the edges of the gate structure;
etching a source region and a drain region adjacent to the gate structure using the dielectric layer as a protective layer;
etching a portion of the gate structure to form a recessed region within the sidewall spacer structures;
depositing a silicon germanium material into the source region and the drain region to fill the etched source region and the etched drain region and into the recessed region in the gate structure; and
causing a channel region between the source region and the drain region to be strained in compressive mode from at least the silicon germanium material formed in the source region and the drain region;
wherein etching a source region and a drain region and etching a portion of the gate structure are performed simultaneously,
wherein the silicon germanium material filled in the recessed region forms an integrated gate structure, the integrated gate structure has a lower sheet resistance than a polysilicon layer, and
wherein the gate structure has a remaining thickness of 100 Angstroms and greater after forming the recessed region.

2. The method of claim 1 wherein the second dielectric layer is less than 300 Angstroms.

3. The method of claim 1 wherein the channel region has a length of a width of the gate structure.

4. The method of claim 1 wherein the semiconductor substrate is silicon material.

5. The method of claim 1 wherein the silicon germanium material is single crystalline and the silicon germanium material is simultaneously deposited in the etched source region, etched drain region, and the recessed region.

6. The method of claim 1 wherein the silicon germanium material has a ratio of silicon/germanium of 7/3 to 9/1.

7. The method of claim 1 further comprising forming a silicided metal layer overlying the gate structure.

8. The method of claim 7 wherein the silicided metal layer is a nickel bearing material.

9. The method of claim 1 wherein the depositing is provided using an epitaxial reactor.

10. The method of claim 1 wherein the compressive mode increases a mobility of holes in the channel region.

11. The method of claim 1 wherein the integrated gate structure has a sheet resistivity of 20 ohm/square and less.

12. The method of claim 1 wherein the etching of the gate structure removes a thickness of the gate layer.

13. The method of claim 1 wherein the gate layer has an initial thickness of about 800 Angstroms to 2000 Angstroms.

14. The method of claim 1 wherein the silicon germanium fill material in the gate structure has a boron bearing impurity.

15. The method of claim 1 further comprising forming a nickel germanium silicide overlying the silicon germanium on the gate layer.

16. The method of claim 1 wherein the silicon germanium material is epitaxially deposited using an in-situ doping technique.

17. The method of claim 16 wherein the in-situ doping technique comprises boron having a concentration ranging from about $1\times10^{19}$ to about $1\times10^{20}$ atoms/cm$^3$.

18. The method of claim 1 wherein the etched source and drain regions comprise a depth in the range from about 100 Angstroms to about 1000 Angstroms.

* * * * *